United States Patent [19]

Krüger et al.

[11] Patent Number: 5,453,690
[45] Date of Patent: Sep. 26, 1995

[54] SQUID MAGNETOMETER IN WHICH FEEDBACK CURRENT FOR A SQUID FLUX-LOCKED-LOOP IS CONDUCTIVELY COUPLED INTO THE INPUT CIRCUIT OF THE SQUID

[75] Inventors: Johann E. W. Krüger, Quickborn; Olaf H. Dössel, Tangstedt, both of Germany

[73] Assignee: U.S. Philips Corporation, New York, N.Y.

[21] Appl. No.: 110,029

[22] Filed: Aug. 20, 1993

[30] Foreign Application Priority Data

Aug. 22, 1992 [DE] Germany ............... 42 27 876.7

[51] Int. Cl.$^6$ ............................................. G01R 33/035
[52] U.S. Cl. ............... 324/248; 505/846; 327/510; 327/527
[58] Field of Search ............... 324/248, 244, 324/260–263; 505/844–846; 307/306

[56] References Cited

U.S. PATENT DOCUMENTS

| | | | |
|---|---|---|---|
| 4,389,612 | 6/1983 | Simmonds et al. | 324/248 |
| 4,689,559 | 8/1987 | Hastings et al. | 324/248 |
| 4,700,135 | 10/1987 | Hoenig | 324/248 |
| 4,875,010 | 10/1989 | Yokosawa et al. | 324/248 |
| 4,947,118 | 8/1990 | Fujimaki | 324/248 |
| 5,095,270 | 3/1992 | Ludeke | 324/248 |
| 5,122,744 | 6/1992 | Koch | 324/248 |
| 5,130,691 | 7/1992 | Shintaku et al. | 324/248 X |

FOREIGN PATENT DOCUMENTS

| | | |
|---|---|---|
| 3926917 | 2/1991 | Germany . |
| 2298878 | 12/1990 | Japan . |

*Primary Examiner*—Walter E. Snow
*Assistant Examiner*—Warren S. Edmonds
*Attorney, Agent, or Firm*—Jack D. Slobod

[57] ABSTRACT

The feedback current for the flux-locked-loop of a DC-SQUID is conductively supplied directly to the input circuit of the SQUID rather than to a separate feedback or modulation coil that is inductively coupled to the SQUID, thereby eliminating the feedback or modulation coil and simplifying construction of an integrated SQUID module.

10 Claims, 1 Drawing Sheet

SQUID MAGNETOMETER IN WHICH FEEDBACK CURRENT FOR A SQUID FLUX-LOCKED-LOOP IS CONDUCTIVELY COUPLED INTO THE INPUT CIRCUIT OF THE SQUID

BACKGROUND OF THE INVENTION

1. Field of the Invention

The invention relates to a magnetometer, comprising a SQUID and a circuit arrangement for operating the SQUID, which circuit arrangement includes a coupling-in coil in a damped measuring circuit and at least one resistor, and also connection leads and contact pads whereto the SQUID, a gradiometer and electronic control circuitry are connected.

2. Description of the Related Art

Magnetometers of this kind are known. For example, from the article "Principles and Applications of SQUIDs", J. Clarke Proc. IEEE Vol. 77, No. 8, p. 1208 (1989), the preferred arrangement of a DC-SQUID for biomagnetic sensors is known. In this arrangement, a measuring circuit is associated with a SQUID ring consisting of a superconducting SQUID inductance with Josephson contacts. The measuring circuit comprises a coupling-in coil which is ultimately connected, via connection wires, to a gradiometer which serves as a measuring coil. The measuring circuit, consisting of the coupling-in coil with connection leads and also the gradiometer, must be superconducting. An external magnetic field, or more specifically its gradient, causes a current in the gradiometer which ultimately generates a magnetic flux in the SQUID ring, via the coupling-in coil. In order to enable said external magnetic flux to be coupled into the SQUID ring with an as high as possible efficiency, the coupling between the coupling-in coil and the SQUID ring must be as rigid as possible. A coupling factor of up to 0.9 can be achieved between the coupling-in coil and the SQUID ring. In order to damp parasitic effects which would cause degradation of the sinusoidal SQUID characteristic, a resistor is connected parallel to the coupling-in coil in the simplest case.

In order to linearize the output signal and to achieve adequate measuring dynamics, a SQUID is operated in a so-called flux-locked-loop circuit. This is to be understood to mean an integrating control circuit which ensures that, despite external fields, the flux in the SQUID ring remains at the point of highest sensitivity. In order to achieve this, according to the prior art the output current of the controller is fed back to a modulation coil magnetically associated with the SQUID ring. This current is then also proportional to the external magnetic field to be measured. The coupling factor between this modulation coil and the SQUID ring per se can be chosen at random and typically amounts to 0.5. The input signal for the electronic control circuit is derived from two contact pads (contact points) which are connected to the SQUID ring via connection leads. At the same time a bias current is applied to this current path in order to adjust the optimum working point.

Further embodiments of such circuit arrangements for magnetometers are known, for example from U.S. Pat. No. 4,389,612, or German Patent Application P 39 26 917. The circuit arrangements disclosed therein relate to an implementation on a DC basis or an implementation utilizing an alternating bias current. These applications also require a modulation current of corresponding frequency. It is superposed on the controller current and hence fed into the modulation coil.

Also to be mentioned is the Abstract JP-A-2-29 8878 which, however, relates to an arrangement in which the coupling-in coil is opened and fed out in order to insert additional coils. The aim is to increase the dynamic range of the system; however, this makes sense only for so-called digital SQUIDs and is of no significance for the conventional SQUIDs considered herein.

Inductive coupling is also possible for applications as known from the article "Elimination of flux-transformer crosstalk in multi-channel SQUID magnetometers", H. J. M. ter Brake, F. H. Fleuren, J. A. Ulfman, J. Flokstra, Cryogenics, Vol. 26, pp. 667–670 (1986), where absolute non-interaction is required, i.e. where not only the flux in the SQUID but also the current produced by the external field in the gradiometer must be compensated to zero.

In all these applications the SQUID (or the SQUID ting), the coupling-in coil and the modulation coil etc are often integrated on a single chip, thus forming a SQUID module. The manufacture of such a complete circuit arrangement, however, is a difficult and complex technological process where each additional manufacturing step reduces the yield. Therefore, the modulation coil is often constructed separately so as to be mounted on the actual SQUID module only at a later stage. Apart from the additional effort then required, increased tolerances occur in respect of the coupling factor between the SQUID ring and the modulation coil. However, because this coupling factor has a direct effect on the circuit gain of the controller, the adjustment range of the latter must be increased accordingly.

A further step required according to the state of the art is imposed by the possibility of freezing of the magnetic flux of a SQUID module. This is because it often occurs that SQUIDs, because of their superconducting structures, freeze magnetic fluxes which are caused by external disturbances of an electric and/or magnetic nature, ultimately resulting in degeneration of their characteristic. Relief in this respect is only provided by heating, i.e. briefly exceeding the transition temperature of the superconducting materials used. From U.S. Pat. No. 4,689,559, it is known to arrange a heating resistor in the vicinity of the SQUID (or the SQUID ring), which resistor need receive comparatively large current and voltage values via additional connection leads.

SUMMARY OF THE INVENTION

It is an object of the present invention to provide a magnetometer of the kind set forth in which the circuit arrangement enables non-interacting, integrating control circuit and special functions and at the same time has a simple construction, so that its manufacture is substantially simplified.

This object is achieved in accordance with the invention in that there are provided a first and a second connection lead between the measuring circuit and a first and a second contact pad for connection of at least the output signal of the electronic control circuitry and for conductively coupling-in the integrated controller current provided thereby, the SQUID signal being available as the input signal for the electronic control circuitry via a fifth and a sixth contact pad.

As opposed to the prior art, in accordance with the invention the controller current should be conductively coupled into the coupling-in coil. In accordance with the invention, this is realised via a first and a second connection lead which are connected to the electronic control circuitry on the one side, via a first and a second contact pad, and on the other side conductively to a third and a fourth connection lead of the measuring circuit, so that ultimately they are also connected directly to the coupling-in coil. As a result, a modulation coil as required according to the state of the art can be completely dispensed with. The problems inherent of the use of the modulation coil are thus overcome in accordance with the invention.

It can be mathematically demonstrated that, as has already been confirmed by measurements, the overall behaviour of a prior-art circuit arrangement comprising a modulation coil and that of the circuit arrangement in accordance with the invention, involving conductive coupling-in, is identical. Whereas in the prior-art circuit arrangement comprising a modulation coil the magnetic fluxes of the coupling-in coil and the modulation coil in the SQUID ring are compensated to zero, in the circuit arrangement in accordance with the invention the current in the coupling-in coil is compensated to zero, and hence also the flux in the SQUID ring. If the individual currents were applied to the connection leads in a circuit arrangement in accordance with the invention, it would become evident that the current in a gradiometer would not disappear due to the compensation in accordance with the invention, but would be increased. Less evident is the fact that this actually undesirable effect also occurs in a circuit arrangement comprising a modulation coil, because the same increase would occur in the event of a theoretical coupling factor of 1.

In a further embodiment of the invention, when slightly modified the circuit arrangement can also be used for other applications for which absolute non-interaction is required, i.e. applications where not only the flux in the SQUID but also the current produced in the gradiometer by the external field is to be compensated to zero. For these applications conductive coupling in of the controller current into the measuring circuit is again possible and simpler than the inductive coupling customarily used in the prior art. In accordance with the invention, in that case an additional superconducting inductance is provided in the measuring circuit.

In accordance with the invention, this additional superconducting inductance can be inserted in the third connection lead to the gradiometer. It may form part of the third connection lead and be arranged therein so as to be oriented towards the gradiometer. Its end facing the gradiometer is then connected to the first connection lead and its end facing the coupling-in coil is connected to the second connection lead. By feeding in the controller current at the terminal points of the additional inductance, the current outside the inductance is compensated and the current inside the inductance is increased until the overall flux is concentrated in the inductance, because the sum of all fluxes remains constant. In accordance with the invention, the inductance is not magnetically coupled to the other inductances of the SQUID module.

In a further embodiment of the invention, the freezing of a SQUID module can be prevented in a magnetometer in accordance with the invention in a quasi-incidental manner which is also very simple from a manufacturing point of view. To this end, additional resistors are provided besides a first resistor which, like in prior art, is connected parallel to the coupling-in coil.

The additional resistors are first of all a second resistor which is inserted in a fifth connection lead which interconnects the first and the second contact pad, and also a third and a fourth resistor, the third resistor being inserted in the first connection lead and the fourth resistor being inserted in the second connection lead. Like in prior art, the first resistor serves essentially for damping parasitic effects. The further resistors first of all serve as lead terminations in that in cooperation they correspond to approximately the characteristic impedance of the lead.

In conformity with the resistance ratio of the second to the third or the fourth resistor, the controller current sensitivity is reduced to a desired level. This is because excessively rigid coupling results in an undesirably high sensitivity to RF stray radiation.

In order to prevent possible freezing of the magnetic flux in the SQUID of the magnetometer in accordance with the invention, or of the superconducting materials, and to simplify the manufacture of the magnetometer in accordance with the invention as much as possible, if desired the second, the third and the fourth resistor also act as heating resistors.

Using a switch (not described herein), for example in the electronic control circuitry, the relevant connection leads can be uncoupled so to say from the controller output so as to be connected to a heating current source. Because these resistors in accordance with the invention physically are situated very near to the SQUID ring, a brief heating current pulse of a few mA already suffices, thus enabling the double function of the resistors.

In a further embodiment of the invention, the circuit arrangement comprising the four resistors can be realised as a thick-film circuit on a ceramic substrate. The ceramic substrate has a length of a few centimeters, a width of a few millimeters and a thickness of approximately one half millimeter and at the same time serves as a supporting plate for the SQUID ring, which may have a square shape, the length of its sides being smaller than the width of the ceramic substrate, its thickness being approximately the same. In accordance with the invention, it is mounted centrically with respect to the four resistors. Moreover, in accordance with the invention the conductor tracks and contact pads for the connection of the SQUID ring, the gradiometer and the connection leads to the electronic control circuitry are also realised on the supporting plate in a thick-film technique. The coupling-in coil can also be realised directly on the ceramic substrate by way of a thick-film technique. However, it may also form an integral part of the SQUID ring which in that case comprises appropriate contacts the ends of the third and the fourth connection lead, provided with further contact pads, then being connected thereto. A circuit arrangement in accordance with the invention thus completed constitutes a complete SQUID module.

BRIEF DESCRIPTION OF THE DRAWINGS

Embodiments of the invention will be described in detail hereinafter with reference to a drawing. Therein.

DETAILED DESCRIPTION OF THE PREFERRED EMBODIMENTS

Figure 1:
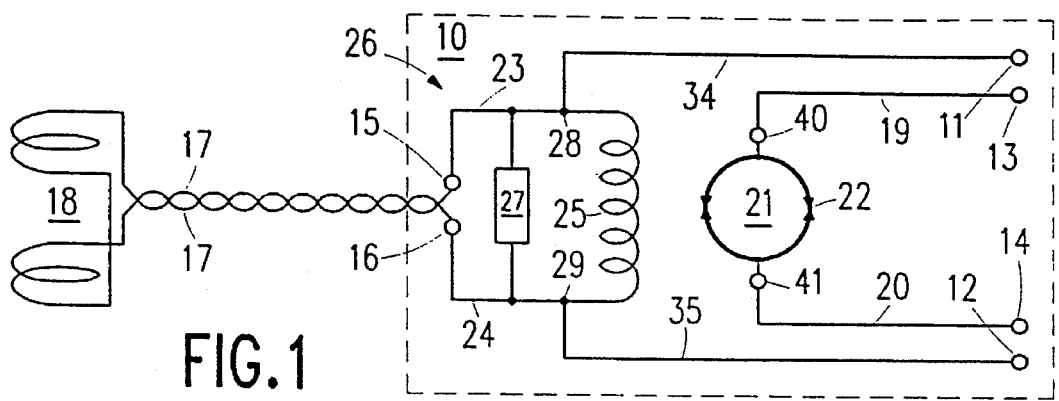
FIG. 1 shows an embodiment of a circuit arrangement for a magnetometer in accordance with the invention, comprising a SQUID and a gradiometer.

FIG. 1 shows a circuit arrangement 10 which, when supplemented by a SQUID and a coupling-in coil, forms a so-called SQUID module as part of a magnetometer. The circuit arrangement 10 is connected on the one side to electronic control circuitry (not shown), via a first and a second contact pad (11 and 12) as well as a fifth and a sixth contact pad (13 and 14) and on the other side, via a third and a fourth contact pad 15, 16, to a gradiometer 18 via connection leads 17. The circuit arrangement 10 also comprises a sixth and a seventh connection lead 19, 20 which are connected on the one side to the actual SQUID 21, i.e. the SQUID ring with Johnson contacts 22, and on the other side to the corresponding contact pads 13 and 14. As has already been stated, the connection leads 17 are connected to the contact pads 15 and 16 which are connected, via a third and a fourth connection lead 23, 24, to a coupling-in coil 25 and form a measuring circuit 26. The terminal points of the coupling-in coil 25 are connected to a first damping resistor 27.

As in the prior art, flux-locking is achieved by, in response to a controller input signal produced by SQUID 21 via fifth and sixth contact pads 13, 14, the electronic control circuitry producing an output signal via first and second contact pads 11, 12 causing a control current for effecting the flux in SQUID 21. However, in accordance with the invention, a modulation coil as required in the prior art can be fully dispensed with in that the first and the second connection lead (34, 35) are conductively connected directly to the measuring circuit at the points 28 and 29.

Figure 2:
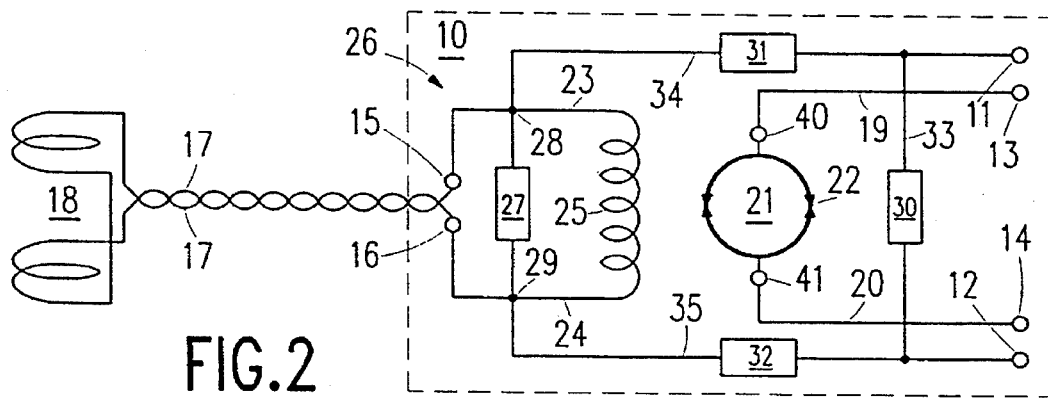
FIG. 2 shows a circuit arrangement as shown in FIG. 1, comprising additional resistors.

FIG. 2 shows a further circuit arrangement 10 which is supplemented by a second, a third and a fourth resistor, 30, 31 and 32, respectively, relative to the circuit arrangement shown in FIG. 1. The second resistor 30 is inserted in a fifth connection lead 33 which interconnects the first and the second contact pad 11, 12. The third resistor 31 is inserted in the first connection lead 34, and the fourth resistor 32 is inserted in the second connection lead 35. These resistors are capable of performing various functions.

On the one hand they serve as a lead termination in that in cooperation they correspond approximately to the characteristic impedance of the lead. Using the resistance ratio of the second resistor 30 to the third resistor 31 or the fourth resistor 32, the controller current sensitivity can be reduced to a desired level. This is because excessively rigid coupling results in an undesirably high sensitivity to RF stray radiation.

If necessary, the resistors 30, 31 and 32 can also be used together for heating, an energy of only approximately 0.1 Ws (for 2 V×25 mA×2 s) being required because of the optimum positioning, as described hereinafter, relative to the SQUID on the corresponding first and second contact pads 11 and 12. The further connection leads and resistors required for heating in conformity with the state of the art can thus be dispensed with. It is to be noted that the first resistor 27, included in the measuring circuit and serving essentially for damping parasitic effects, and said further resistors 30, 31, 32 are realised together as a common thick-film circuit.

Figure 3:
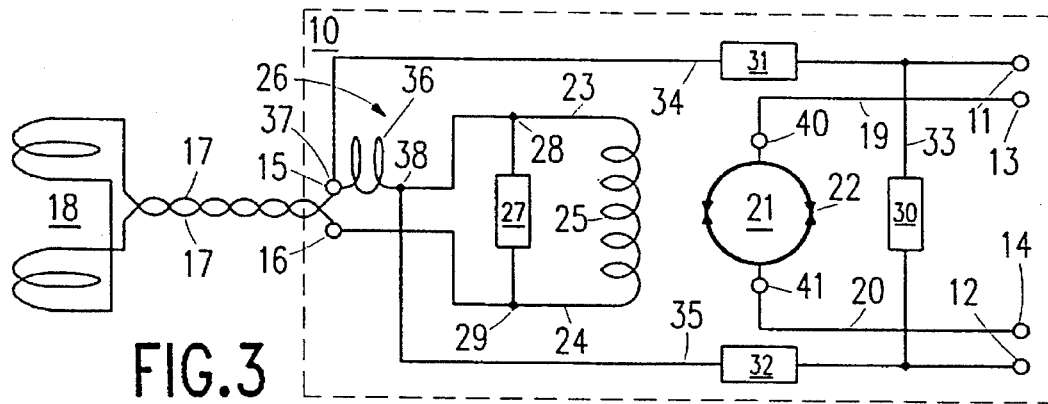
FIG. 3 shows a circuit arrangement as shown in FIG. 2, comprising an additional inductance in the measuring circuit.

FIG. 3 shows a further version of the circuit arrangement 10 shown in the FIGS. 1 and 2. This version, actually concerning an additional inductance 36 having the terminal points 37 and 38 and being inserted in the measuring circuit 26, makes the circuit arrangement 10 in accordance with the invention also suitable for applications where absolute non-interaction is required, i.e. applications where not only the flux in the SQUID ring 21 but also the current produced by the external field in the gradiometer 18 must be compensated to zero. The additional superconducting inductance 36 is to be inserted in the measuring circuit 26 in accordance with the invention so that on the one side its terminal 37 is connected to one of the connection leads 17 to the gradiometer (18) and on the other side its connection terminal 38 is connected to the third connection lead 23. In this embodiment of the invention, the first connection lead 34 is conductively connected to the connection terminal 37 and the second connection lead 35 is conductively connected to the connection terminal 38. As a result of the coupling-in of the controller current to the terminal points of the inductance 36, the current outside the inductance 36 is compensated and in the inductance itself it is increased until the overall flux is concentrated in the inductance 36 because the sum of all fluxes remains constant. However, in accordance with the invention the inductance 36 may not be magnetically coupled to the other inductances.

Figure 4:
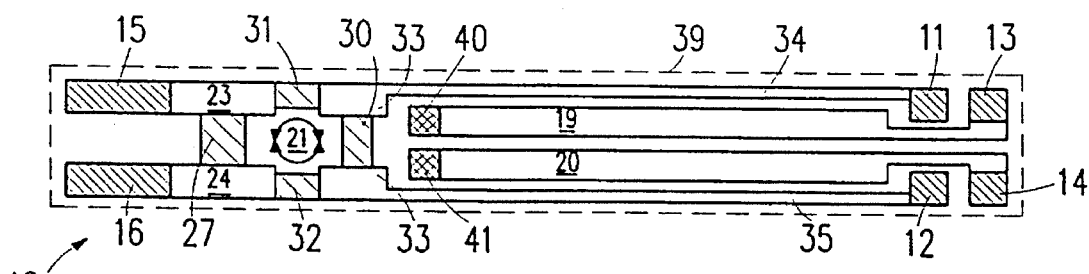
FIG. 4 shows a thick-film circuit arrangement on a supporting substrate.

FIG. 4 shows a circuit arrangement 10 realised on a ceramic supporting plate 39 on which all four resistors 27, 30, 31 and 32 as well as all contact pads 11, 12, 13, 14, 15, 16, 40 and 41 and all connection leads 19, 20, 23, 24, 33, 34 and 35 are provided directly as a thick-film circuit. The ceramic substrate 39 is dimensioned approximately 25 mm×4 mm×0.6 mm and, as already been stated, at the same time serves as a supporting plate for the coupling-in coil and the SQUID ring which has a square shape and is dimensioned approximately 3.5 mm×3.5 mm×0.5 mm. As is shown, the SQUID ring 21 is positioned centrally with respect to the four resistors 27, 30, 31 and 32 arranged in the square. The coupling-in coil 25 and associated contacts whereto the third and the fourth connection lead are connected form an integral part of the SQUID ring.

Contrary to the prior art, in this embodiment no further connection leads or resistors for heating are required and, because the four resistors are positioned extremely near to the SQUID ring 21, a brief heating current pulse of a few mA suffices for heating.

The features of the invention as disclosed in the above description, in the FIGS. 1, 2, 3 and 4 as well as in the claims can be of essential importance, both individually as well as in arbitrary combinations, for implementing the various embodiments of the invention.

We claim:

1. A SQUID module adapted to be connected to a gradiometer and to electronic control circuitry for controlling flux locking of said SQUID module, said SQUID module comprising a SQUID ring conductively coupled to a first pair of contact pads for connection to an input of said control circuitry and a damped measuring circuit which is conductively coupled both to a second pair of contact pads for connection to said gradiometer and to a third pair of contact pads for connection to an output of said control circuitry, said measuring circuit including a coupling-in coil and at least one resistor.

2. A SQUID module as claimed as claimed in claim 1, wherein the at least one resistor is connected in parallel with said coupling-in coil.

3. A SQUID module as claimed in claim 1, wherein said damped measuring circuit is conductively coupled to one of said second pair of contact pads via a superconducting inductance which is located and oriented so that it is not magnetically coupled to any other inductance of the SQUID module.

4. A SQUID module as claimed in claim 1, wherein said measuring circuit is conductively coupled to one of said third pair of contact pads via a first further resistor.

5. A SQUID module as claimed in claim 1, wherein said measuring circuit is conductively coupled to one of said third pair of contact pads via a first further resistor and the other of said third pair of contact pads via a second further resistor.

6. A SQUID module as claimed in claim 1, wherein said measuring circuit is conductively coupled to one of said third pair of contact pads via a first further resistor and the other of said third pair of contact pads via a second further resistor, wherein said third pair of contact pads are interconnected via a third further resistor.

7. A SQUID module as claimed in claim 6, wherein the first, second and third further resistors together form a termination of a line via which the measuring circuit is conductively coupled to said third pair of contact pads, which termination corresponds approximately to a characteristic impedance of said line.

8. A SQUID module as claimed in claim 6, wherein the SQUID ring comprises superconducting material and the first, second and third further resistors are configured for a heating function and are oriented towards the SQUID ring so that the transition temperature of the superconducting material is briefly exceeded when an energy of approximately 0.1 Ws is applied via the third pair of contact pads.

9. A SQUID module as claimed in claim 6, wherein the coupling-in coil, the first second and third pairs of contact pads, the first, second, and third further resistors, and connection leads included in the conductive connections between the SQUID ring and the first pair of contact pads and between the measuring circuit and the second and third pairs of contact pads are provided in the form of a thick-film circuit on a ceramic substrate which forms a support for the SQUID module.

10. A SQUID module as claimed in claim 6, wherein the at least one resistor and the first, second, and third further resistors are arranged in a square and SQUID ring is centrically mounted relative to said square.

* * * * *